(12) United States Patent
Mieher et al.

(10) Patent No.: US 6,486,954 B1
(45) Date of Patent: Nov. 26, 2002

(54) OVERLAY ALIGNMENT MEASUREMENT MARK

(75) Inventors: Walter Dean Mieher, Santa Clara; Ady Levy, Sunnyvale, both of CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 157 days.

(21) Appl. No.: 09/654,318

(22) Filed: Sep. 1, 2000

(51) Int. Cl.$^7$ ............................................... G01B 11/27
(52) U.S. Cl. ....................................... 356/401; 356/399
(58) Field of Search ................................. 356/401, 399; 437/924

(56) References Cited

U.S. PATENT DOCUMENTS

| | | |
|---|---|---|
| 4,475,811 A | 10/1984 | Brunner |
| 4,538,105 A | 8/1985 | Ausschnitt |
| 4,703,434 A | 10/1987 | Brunner |

(List continued on next page.)

OTHER PUBLICATIONS

US 5,841,144, 11/1998, Cresswell (withdrawn)
Harry J. Levinson, "Lithography Process Control", Bellingham, Washington USA, Tutorial Texts in Optical Engineering vol. TT28, SPIE Optical Engineering Press, pp. 96–107.
Giovanni Rivera et al., "Overlay Performance on Tungsten CMP Layers Using the ATHENA Alignment System", STMicroelectronics in Agrate, Agrate Brianza, Italy.
Chungwei Hsu, Ron Chou, Tsu–Wen Hwang, "Characterizing lens distortion to overlay accuracy by using fine measurement pattern", Mar. 1999, Santa Clara, Calif., Part of the SPIE Conference on Metrology, SPIE vol. 3677.

*Primary Examiner*—Frank G. Font
*Assistant Examiner*—Layla Lauchman
(74) *Attorney, Agent, or Firm*—Beyer Weaver & Thomas, LLP

(57) ABSTRACT

An alignment mark comprising a first test zone and a second test zone for measuring the relative position between different layers of a semiconductor device. The alignment mark is used to determine the overlay error between layers of a semiconductor wafer while minimizing measurement inaccuracies caused by semiconductor manufacturing processes. The first test zone includes two sections, one in which test structures are formed on one layer and a second in which test structures are formed on a second layer. Each of these test structures is composed of smaller sub-structures. The second test zone includes two similar sections that are also composed of smaller sub-structures. The first and second test zones are configured so that the section of each test zone formed one layer is adjacent to the section of the other test zone that is formed on the other layer. By forming each of the periodic structures with smaller sized sub-structures, a more accurate measurement of any alignment error may be obtained. Another aspect of the present invention pertains to a method of utilizing the alignment mark so that an overlay measurement may be obtained.

38 Claims, 9 Drawing Sheets

U.S. PATENT DOCUMENTS

| | | |
|---|---|---|
| 4,714,874 A | 12/1987 | Morris et al. |
| 4,757,207 A | 7/1988 | Chappelow et al. |
| 4,778,275 A | 10/1988 | van den Brink et al. |
| 4,782,288 A | 11/1988 | Vento |
| 4,820,055 A | 4/1989 | Müller |
| 4,855,253 A | 8/1989 | Weber |
| 4,929,083 A | 5/1990 | Brunner |
| 5,017,514 A | 5/1991 | Nishimoto |
| 5,112,129 A | 5/1992 | Davidson et al. |
| 5,148,214 A | 9/1992 | Ohta et al. |
| 5,156,982 A | 10/1992 | Nagoya |
| 5,172,190 A | 12/1992 | Kaiser |
| 5,216,257 A | 6/1993 | Brueck et al. |
| 5,262,258 A | 11/1993 | Yanagisawa |
| 5,296,917 A | 3/1994 | Kusonose et al. |
| 5,383,136 A | 1/1995 | Cresswell et al. |
| 5,414,514 A | 5/1995 | Smith et al. |
| 5,436,097 A | 7/1995 | Norishima et al. |
| 5,438,413 A | 8/1995 | Mazor et al. |
| 5,477,057 A | 12/1995 | Angeley et al. |
| 5,479,270 A | 12/1995 | Taylor |
| 5,498,501 A | 3/1996 | Shimoda et al. |
| 5,596,413 A | 1/1997 | Stanton et al. |
| 5,617,340 A | 4/1997 | Cresswell et al. |
| 5,627,083 A | 5/1997 | Tounai et al. |
| 5,665,495 A | 9/1997 | Hwang |
| 5,699,282 A | 12/1997 | Allen et al. |
| 5,701,013 A | 12/1997 | Hsia et al. |
| 5,702,567 A | 12/1997 | Mitsui et al. |
| 5,703,685 A | 12/1997 | Senda et al. |
| 5,712,707 A | 1/1998 | Ausschnitt et al. |
| 5,757,507 A | 5/1998 | Ausschnitt et al. |
| 5,766,809 A | 6/1998 | Bae |
| 5,783,342 A | 7/1998 | Yamashita et al. |
| 5,805,290 A | 9/1998 | Ausschnitt et al. |
| 5,835,196 A | 11/1998 | Jackson |
| 5,857,258 A | 1/1999 | Penzes et al. |
| 5,872,042 A | 2/1999 | Hsu et al. |
| 5,877,036 A | 3/1999 | Kawai |
| 5,877,861 A | 3/1999 | Ausschnitt et al. |
| 5,902,703 A | 5/1999 | Leroux et al. |
| 5,912,983 A | 6/1999 | HIratsuka |
| 5,923,041 A | 7/1999 | Cresswell et al. |
| 5,939,226 A | 8/1999 | Tomimatu |
| 5,949,145 A | 9/1999 | Komuro |
| 5,968,693 A | 10/1999 | Adams |
| 6,020,966 A | 2/2000 | Ausschnitt et al. |
| 6,023,338 A | 2/2000 | Bareket |
| 6,077,756 A | 6/2000 | Lin et al. |
| 6,079,256 A | 6/2000 | Bareket |
| 6,118,185 A | 9/2000 | Chen et al. |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,140,217 A | 10/2000 | Jones et al. |
| 6,146,910 A | 11/2000 | Cresswell et al. |
| 6,160,622 A | 12/2000 | Dirksen et al. |
| 6,165,656 A | 12/2000 | Tomimatu |

OVERLAY ALIGNMENT MEASUREMENT MARK

CROSS-REFERENCE TO RELATED APPLICATION

This application is related to commonly assigned U.S. Pat. No. 6,023,338, entitled "OVERLAY ALIGNMENT MEASUREMENT OF WAFERS," filed Jul. 12, 1996 by Noah Bareket and to U.S. patent application Ser. No. 09/603,120, entitled "OVERLAY ALIGNMENT MARK DESIGN," filed Jun. 22, 2000 by Noah Bareket. Both the U.S. Patent and the U.S. Patent Application mentioned above are hereby incorporated by reference in their entirety.

FIELD OF THE INVENTION

The present invention relates generally to testing procedures for the semiconductor manufacturing process. More specifically, the present invention relates to alignment marks for measuring alignment error between different layers or different exposures on the same layer of a semiconductor wafer stack.

BACKGROUND

One of the most critical process control techniques used in the manufacturing of integrated circuits is the measurement of overlay accuracy between successive, patterned layers on a wafer. Overlay accuracy pertains to the determination of how accurately a patterned layer aligns with respect to the layer above or below it, or multiple exposures in the same layer.

Presently overlay measurements may be performed with test patterns that are printed onto the layers of a semiconductor wafer. As generally known, patterns may be printed onto semiconductor wafer layers through lithographic methods. Such methods generally involve applying a layer of photoresist material to a wafer layer, shining a light source through a patterned mask to expose certain areas of the photoresist, developing the exposed resist to produce the desired pattern of remaining resist, and then etching or implanting, etc. the surface of the wafer that is exposed through the photoresist. One type of test pattern for overlay measurement consists of sets of parallel patterns that are placed proximate to each other. The sets of parallel patterns formed on different wafer layers are positioned such that the a pattern from one set will align with a respective pattern from the other set when the layers are properly aligned. This test pattern and variations of this pattern are effective for determining the overlay error. However, inherent aspects of the lithographic processes and other semiconductor manufacturing processes limit the accuracy with which the test patterns may provide information as to the device overlay error. Optical lens aberrations of the lithography patterning equipment can cause pattern placement errors that are dependent on feature size, spacing, shape and location, and illumination conditions, including off-axis illumination and partial coherence. Other semiconductor manufacturing processes are also feature size dependent. It would be desirable to have overlay test patterns capable of improving the correlation between the overlay error measured on the test pattern and the real overlay error of the circuit components.

SUMMARY

The present invention is directed towards alignment marks and methods for determining the overlay error between layers of a semiconductor wafer while minimizing measurement inaccuracies caused by semiconductor manufacturing processes. The present invention, in each of the various embodiments, uses alignment marks that are composed of periodic structures formed on each of two layers of a semiconductor wafer to provide alignment information between those two layers of the semiconductor device. The alignment marks are formed in specific locations on each wafer layer such that the alignment marks on one layer will be aligned with the mark on the other layer when the two layers are properly aligned. It follows that when the two layers are properly aligned, it is more likely that the integrated circuit patterns on the two layers will be aligned. Therefore, the degree of alignment between the circuit patterns on each wafer layer may be determined by measuring the alignment between the marks on each layer.

One aspect. of the invention pertains to an alignment mark for measuring the relative position between different layers of a semiconductor device. The alignment mark includes a first test zone and a second test zone. The first test zone includes two sections, one in which test structures are formed on one layer and a second in which test structures are formed on a second layer. Each of these test structures are composed of smaller sub-structures. The second test zone includes two similar sections that are also composed of smaller sub-structures. By forming each of these test structures with sub-structures that are sized closer to the size of the actual circuits, a more accurate measurement of any alignment error in such circuits is obtained. The first and second test zones are configured so that the section of each test zone formed in one layer is adjacent to the section of the other test zone which is formed on the other layer. Another aspect of the present invention pertains to a method of utilizing the alignment mark so that an overlay measurement may be obtained.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail so not to unnecessarily obscure the present invention.

The present invention, in each of the various embodiments, uses alignment marks that are composed of periodic structures formed on each of two layers of a semiconductor wafer to provide alignment information between those two layers of the semiconductor device. The alignment marks are formed in specific locations on each wafer layer such that the alignment marks on one layer will be aligned with the mark on the other layer when the two layers are properly aligned. By way of example, a mark on a first a layer may be formed at a certain position relative to the patterns that form the integrated circuits. At the same time, the mark on a second layer may be formed at a certain position that is a certain, but slightly different, relative position from the integrated circuit patterns. The position of the mark on the second layer is set so that it will be adjacent to and aligned with the mark on the first layer when the circuit patterns are properly aligned. Conversely, the marks on each layer will be offset from each other when the two layers are not properly aligned. Each of these periodic structures is composed of sub-structures that are about the same size as structures of the actual integrated circuits. By forming each of the periodic structures with sub-structures that are sized closer to the size of the actual circuits, a more accurate measurement of any alignment error in such circuits is obtained. The periodic structures and sub-structures are formed using lithographic processes that are generally known in the art. For example, the periodic structures and sub-structures may be formations of photoresist material or recessed cavity formations within a wafer layer. The structures and sub-structures formed by cavities may be cavities formed in any of the layers during the semiconductor fabrication process. For example, the cavities may be formed in the photoresist layer, the dialectric material layer, or any of the metal layers. In the following description, the misalignment between two layers of a semiconductor may be referred to as, registration error, misregistration, or overlay error.

Figure 1:
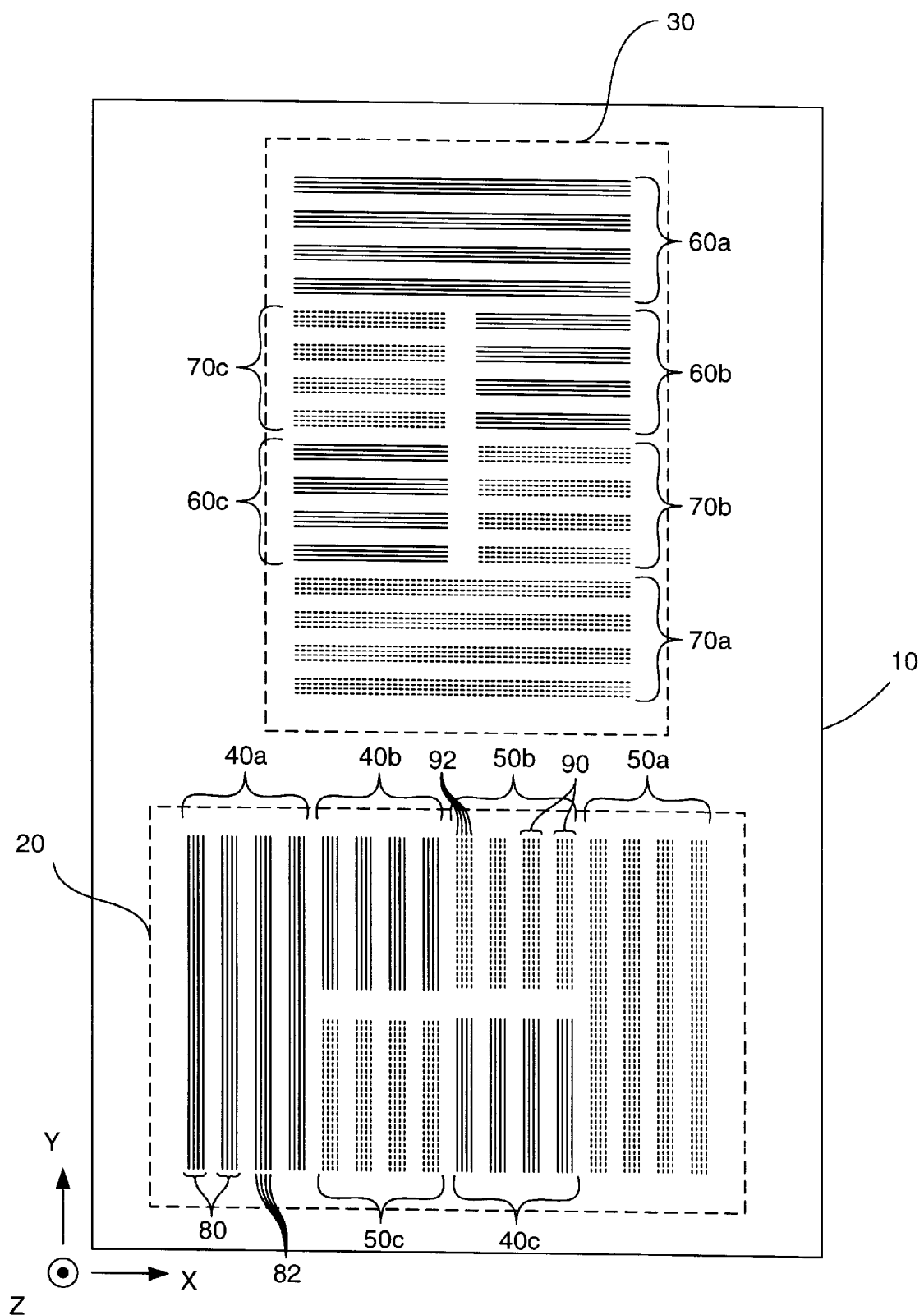
FIG. 1 illustrates a top plan view of an alignment mark, according to one embodiment of the invention, for measuring the alignment error between different layers within a semiconductor wafer stack.

FIG. 1 illustrates a top plan view of an alignment mark 10 according to one embodiment of the invention. Alignment mark 10 is shown in a configuration that results when the tested layers of a wafer are in proper alignment. Alignment mark 10 includes two substantially identical marks, 20 and 30, that are rotated 90 degrees with respect to each other. Given the axis orientation markings in FIG. 1, grating 20 is for x-axis registration measurements, while grating 30 is for y-axis measurements since the lines of the respective grating typically have to be non-parallel to the axis of the measurement to be effective. The user can choose any convenient orientation of the marks relative to the placement of the dies on the wafer so long as that orientation is the same on the layers under test. Additionally, any number of marks may be present on the wafer at various orientations to each other for measuring alignment in different directions. Alternatively, the wafer may include a single mark for measuring misalignment in a single direction. While the marks, 20 and 30, for both the x and y-directions are shown to be proximate to each other, they could be in different locations of the semiconductor wafer.

Each of the marks 20 and 30, as shown in FIG. 1, consist of six sets of periodic structures. Each of the periodic structures is formed by a number of sub-structures. For instance, in FIG. 1, the sub-structures, from a top plan view, appear as thin lines that are parallel to each other. Each periodic structure is essentially a group of sub-structures. In actual use, the space between each of the periodic structures will vary, depending on the required accuracy. In a specific implementation of an alignment mark, the distance between each of the periodic structures is approximately 1 μm.

With respect to the FIGS. 1, 3, 5, 6 and 9 of this specification, note that for the purpose of distinguishing between linearly shaped sub-structures formed on different wafer layers, the sub-structures formed on one layer may be represented with solid lines while the sub-structures formed on a different layer may be represented with dashed lines. Even though some sub-structures may be represented by dashed lines, the linear sub-structures within each periodic structure are not actually discontinuous linear formations that are segmented at regular intervals. The dashed lines actually represent continuous linear formations within each of the periodic structures. However, in alternative embodiments, it is possible that the sub-structures within each periodic structure may take on various shapes and sizes, which include discontinuous linear formations that are segmented at regular intervals.

Directing attention to mark 20 for illustration, the periodic structure sets 40a, 40b and 40c (represented in solid lines) are formed in one layer of the semiconductor wafer, while the periodic structure sets 50a, 50b and 50c (represented in dashed lines) are formed in a different layer of the semiconductor wafer. The shape and position of the underlying mark must be measurable through the upper layers either directly through the upper layers or due to the topography of the upper layers as influenced by the lower mark. Periodic structure sets 40a and 50a form calibration zones that will be used to correct the alignment measurement for errors that may be present due to misalignment between the semiconductor device and the measuring device that is used to make the measurement. Periodic structure sets 40a and 50a each contain periodic structures 80 that are elongated and rectangular in shape. Each of the periodic structures 80 are formed by sub-periodic structures, which, in this case, are individual lines 82.

The periodic structures 40b, 40c, 50b and 50c make up the inner region of the mark 20. Sets 40b and 50c form one test zone and sets 50b and 40c form a second test zone. Each of these test zones may be measured to determine the alignment error between the two layers of the semiconductor wafer. The two alignment measurement values may then be averaged to determine a single and more accurate alignment measurement value. Each of the sets 40b, 40c, 50b and 50c contain individual periodic structures 90 that are also elongated and rectangular in shape. Periodic structures 90, however, are shorter in length than periodic structures 80. Each of the periodic structures 90 are formed by sub-structures, which, in this case are individual lines 92. Thus, given this mark configuration, the registration error between the two layers of the semiconductor wafer in the x-direction may be determined by measuring the amount of juxtaposition between the periodic structures within sets 50b and 40c and between the sets 40b and 50c in mark 20. Similarly, in the mark 30, any registration error in the y-direction will be present between the juxtaposed periodic structures within sets 60b and 70c and between the sets 60c and 70b in mark 30. Those of ordinary skill in the art should recognize that the registration error in each direction can also be measured through the juxtaposition between other combinations of periodic structure sets. For example, the registration error may be measured through the juxtaposition between sets 40b and 50b and between 40c and 50c, in mark 20 (similarly, between sets 60c and 70c and between sets 60b and 70b, in mark 30).

Preferably, the pertinent registration error data is gathered by measuring the distance between the individual periodic structures in each test zone. Resolving each of the individual sub-structures within each of the periodic structures is therefore, not required. Of course, the registration error may also be determined by measuring the distance between each of the sub-structures within each test zone. In this case, the distance between each of the sub-structures may be determined through the use of an electron beam microscope or any other device capable of resolving the position of the sub-structures.

In mark 30, periodic structures 60a, 60b and 60c are shown corresponding to, and being on the same layer of the semiconductor wafer as periodic structures 40a, 40b and 40c in mark 20. Similarly, in mark 30, periodic structures 70a, 70b and 70c are shown corresponding to, and being on the same layer of the semiconductor wafer as periodic structures 50a, 50b and 50c in mark 20. This is for illustration here and need not be matched in this way in actual use (i.e., periodic structures 40a, 40b and 40c and 70a, 70b and 70c might be on the same layer, while periodic structures 50a, 50b, 50c, 60a, 60b and 60c might be on the other layer). In alternative embodiments of the alignment mark, each periodic structure set 40a, 50a, 60a and 70a may be formed by two separate periodic structure sets that are placed end-to-end so that the individual periodic structures 80 are co-linear.

The number of periodic structures within each set of periodic structures is dependent upon the resolution required and on the signal-to-noise ratio desired. From the perspective of the minimum number of each length of lines that is needed for operation, that number is two "a", two "b" and two "c" lines are contributed by each of the two layers of the semiconductor wafer for each of marks 20 and 30, respectively (i.e., two periodic structures within each of 70a, 70b, 70c, 60a, etc.).

The sub-structures used to form each of the periodic structures within the calibration zones and test zones allow the alignment mark to facilitate overlay measurements that more accurately represent the degree of alignment between the wafer layers. That is, the alignment measurements serve to provide alignment information concerning the patterns on each layer that are used to form the integrated circuits. The sub-structures allow for more representative measurements, in part, due to several reasons. First, the smaller sized sub-structures are formed on the semiconductor layer with lens pattern placement errors that are more similar to the lens pattern placement errors with which the patterns for the integrated circuits are formed. Patterns are formed on wafer layers with lithographic devices such as "steppers." The lens placement errors of patterns formed upon a semiconductor wafer change with the size and spacing of the patterns due to aberrations within the stepper lenses, and with the illumination conditions (including off-axis illumination and partial coherence) used to expose the circuit pattern defined on the lithographic mask. Creating marks having feature size and spacing more comparable to that of the integrated circuit element critical dimensions results in mark and integrated circuit patterns that are formed with a more similar degree of lens pattern placement errors. In this manner, the alignment between marks on different layers of a wafer gives a more accurate indication of the alignment between the circuit patterns. For more information regarding distortions due to stepper lens aberrations, see *Lithography Process Control*, by Harry J. Levinson.

In a preferred embodiment, the dimensions of the sub-structures are comparable to the dimensions of the circuit patterns. For example, a sub-structure having a line shape will have a width approximately that of the width of an integrated circuit interconnection line. Currently, circuit interconnection lines have widths that are approximately equal to or less than 0.25 $\mu$m. The sub-structures of the current invention can be made to have widths as small as 0.1–0.2 $\mu$m. However, as can be appreciated, advances in semiconductor manufacturing processes are likely to further reduce these dimensions.

Another reason for which smaller alignment marks provide more accurate overlay measurements is that effects of wafer fabrication asymmetries on overlay measurement may be reduced. Wafer fabrication asymmetries are shifts in the shape and size of structures or patterns that have been formed upon a wafer layer due to further fabrication processes. These shifts in shape and size affect the alignment marks such that accuracy of the overlay measurements may be deteriorated.

An exemplary wafer fabrication technique that may cause wafer structures to gain asymmetrical dimensions in the sputter deposition process. The sputtering process is generally used to apply a layer of material (i.e., metal) on top of an existing wafer layer. Usually, the source of the sputtered material, a target, is located at above the center of the wafer. The sputtered material travels at an angle from the target towards the outer perimeter of a wafer thereby resulting in asymmetrical deposition of material within recessed channels or over ridge-like protrusions. Specifically, the unequal accumulation of deposited material between the sidewalls of a recessed channel may cause a positional shift of the recessed channel towards one side of the channel.

Another exemplary fabrication technique that may cause asymmetrical dimensions is the chemical mechanical planarization (CMP) of wafer layers. In certain circumstances, wafer layers undergo CMP before the next layer of material is deposited. The CMP device generally travels over a wafer layer in a specific direction. The CMP device, therefore, will first encounter one side of an alignment mark and then run down the opposite side of the mark. This results in a shift and reduction in size of the alignment mark since the side of the alignment mark which is encountered first is planarized to a greater degree than the opposite side of the mark.

In both situations, the resulting asymmetries to alignment marks due to the fabrication processes may be reduced by forming smaller marks. With respect to the sputtering process, smaller recessed channels or ridges allows less sputtered material to accumulate on the respective side surfaces, thereby resulting in a smaller asymmetrical shift in shape and size. With respect to the CMP process, marks having smaller dimensions will also be shifted to a lesser degree. Refer to *Lithography Process Control*, by Harry J. Levinson, for further information on wafer fabrication asymmetries.

Forming each of the periodic structures with smaller sub-structures allows each periodic structure to be placed on a wafer layer with a lens pattern placement error to that with which circuit patterns are formed. The sub-structures can be of many varieties of shapes, such as lines, squares, circles, etc. (as viewed from the top plan perspective). As will be described below, the invention may be embodied with many different periodic structure and sub-structure shapes and sizes. It should be noted that since the structures and sub-structures of the present invention are generally formed by lithographic processes, these structures and sub-structures will not have perfectly symmetrical shapes.

Figure 2:
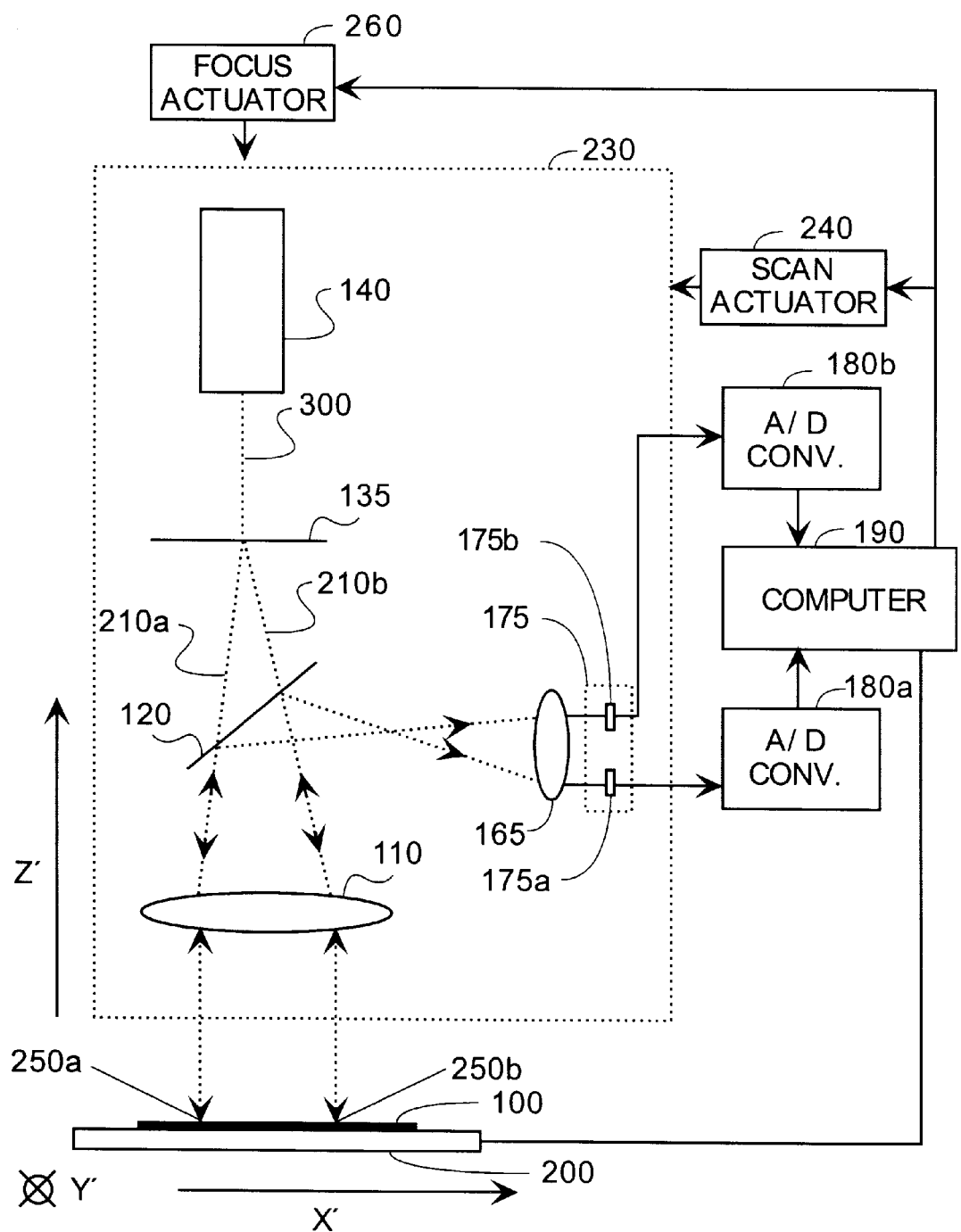
FIG. 2 illustrates one embodiment of an alignment measuring system for the present invention.

FIG. 2 is a diagram of one embodiment of an alignment scanner that utilizes an alignment pattern, such as the alignment pattern 10 discussed in FIG. 1. An alignment mark of the present invention is formed upon the wafer 100 so that any overlay error between the layers of the wafer 100 may be determined. The wafer 100 is set upon the stage 200 so that the measurement process may begin. The stage 200 is typically motor driven under the control of system computer 190 with scan head 230 provided to perform the actual measurements with computer 190 also performing the actual calculations from the data received from scan head 230. There are two options with respect to providing scanning motion between wafer 100 and scan head 230. One is to move stage 200 relative to scan head 230 by computer 190, and the other is to move scan head 230 by computer 190 via scan actuator 240 (e.g., a piezoelectric actuator) relative to stage 200. While either technique can be used, it is preferred to move scan head 230 and hold stage 200 stationary since the scan head can be made much smaller in size and weight relative to the wafer positioning stage. Alternatively, scanning can be. implemented by moving the whole head, or by moving only some of the optical components.

Before proceeding with the discussion of the construction and operation of the alignment scanner in FIG. 2, there are a few definitions to be addressed. In FIG. 2, there are two coordinate systems that define the measurement geometry. One is the coordinate axes of wafer 100 which are referred to as x, y and z (see FIG. 1). The other is the coordinate axes of scan head 230 relative to wafer 100 which is referred to here as x', y' and z', which are as indicated in FIG. 2.

As shown in FIG. 2, the x' axis is horizontal and in the plane of the figure, the z' axis is vertical and in the plane of the figure, and the y' axis (the axis of measurement) is perpendicular to and into the plane of the figure. Thus, in this specific example, the measurement is being made on grating 30 (see FIG. 1). Initially wafer 100 is placed on stage 200 and stage 200 is then aligned by rotating stage 200 so that the x- and y-directions of gratings 20 and 30 on wafer 100 are substantially parallel to x' and y' axes of scan head 230. If the two axes systems are not exactly aligned, then an imaginary line drawn between the measurement path of the two illuminated spots will not be parallel to the axis that is not being measured on wafer 100. The spots are the points where an alignment scanning beam is incident upon the alignment grating. When this imaginary line is not parallel to the axis not being measured, one spot will be slightly advanced along the axis of measurement with respect to the other in the grating pattern being used to measure alignment. When the two axes systems are not exactly aligned, then the misalignment may be referred to as the system-wafer offset.

The optical part of the system of FIG. 2 incorporated within scan head 230 includes light source 140 that directs a beam of light 300 to a diffraction grating 135 where the light is split into two light beams 210a and 210b. One suitable light source 140 may be a diode laser. The diffraction grating 135 may be composed of equally spaced lines of opaque coating on a glass substrate, creating a common optical element that is known as a Ronchi Ruling. As is generally known, multiple light beams may be obtained by using a Ronchi Ruling type grating to split an incident light beam. Then, only the desired number of light beams are utilized, for example, by blocking out the unneeded light beams. The first diffraction orders are separated by an angle $\alpha$, given by the equation $\sin \alpha = 2\lambda/S$, where $\lambda$ is the illumination wavelength and S is the grating period. The two first diffraction orders are used to provide the two illumination beams 210a and 210b. In other embodiments of an alignment scanner, more than two light beams may be utilized. A discussion of the properties of such a grating can be found in *Modern Optical Engineering* by Warren J. Smith, McGraw-Hill, 1990, page 154. Several embodiments of an electron microscope are described in U.S. Pat. No. 6,023,338, which is herein incorporated by reference.

Figure 3:
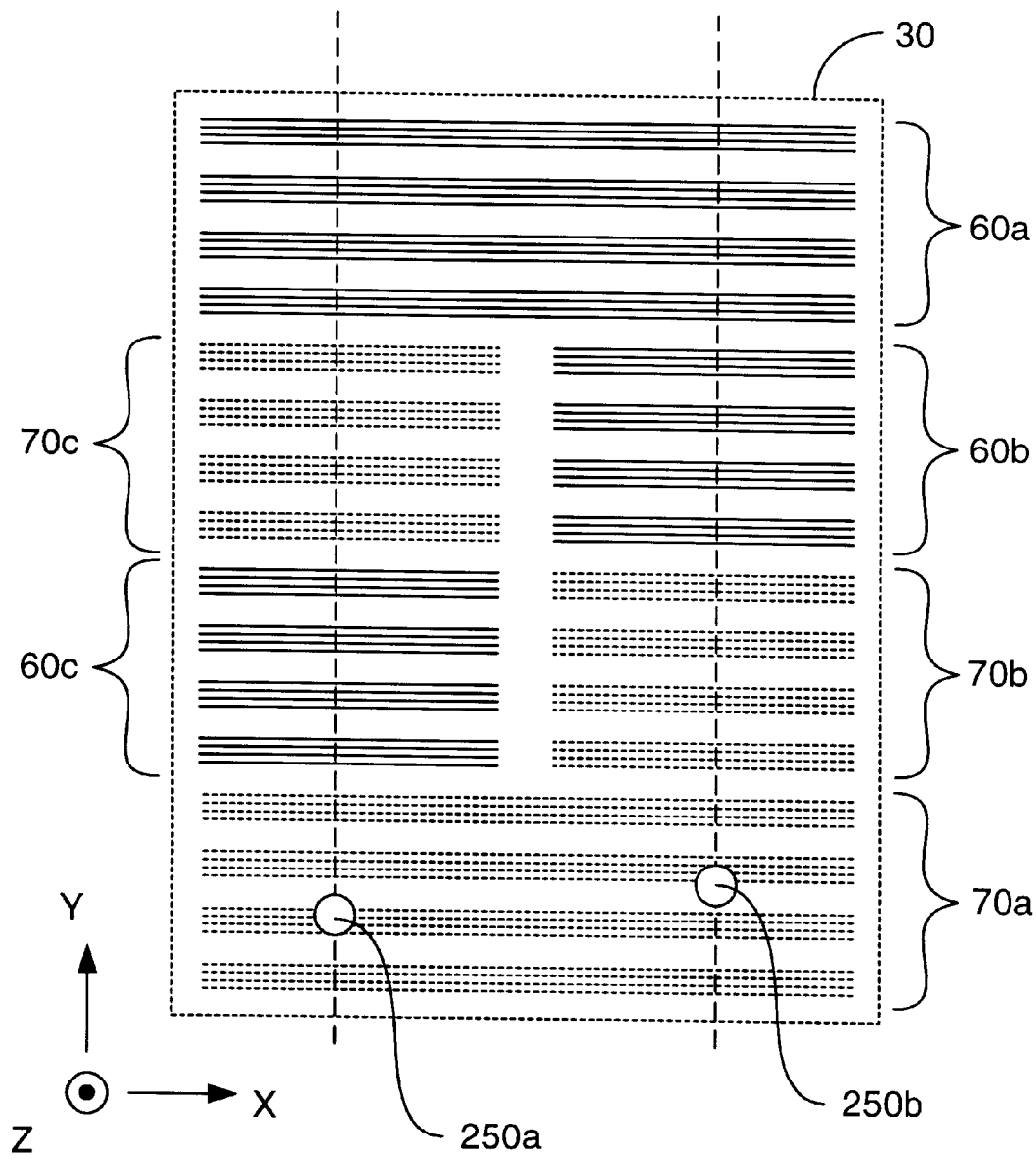
FIG. 3 illustrates a top plan view of an embodiment of an alignment mark of the present invention for measuring the overlay error in the y-direction with a representation of the instantaneous position of two light beams used for measurement purposes.

Light beams 210a and 210b in turn are directed through a first beam splitter 120 that is designed to transmit and reflect light in about equal parts with the two transmitted light beams directed to lens 110 (e.g., a single element or multiple element lens) where the two transmitted light beams are focused by lens 110 at spots 250a and 250b, on grating 30 on wafer 100, as shown in FIG. 3.

The reflected light from each of spots 250a and 250b on wafer 100 is then collected by lens 110, impinges on the first beam splitter 120 where the light is directed substantially 90 degrees towards detector 175. To separate the two beams, they are imaged by lens 165 on detector 175, which comprises two detecting elements, 175a and 175b, as shown in FIG. 2. The non-diffracted zero order light is focused in between the detector elements and does not interfere with the measurement. The signals of each element are digitized by the corresponding A/D converter (180a and 180b), and acquired by computer 190. The phase difference between the two signals is then determined by computer 190 as discussed below in relation to FIGS. 3 and 4. The registration error between two layers of the film stack is directly proportional to the misalignment between the portions of the grating pattern on each of the consecutive layers of the wafer 100 in the direction in which the measurement was made.

To initially focus the light beams on spots 250a and 250b, scan head 230 can be moved in the z-direction under the control of computer 190 by focus acuator 260 to physically raise and lower scan head 230 as necessary. Also, to measure the x-axis of wafer 100, a second optical system could be employed. Wafer 100 could be rotated 90 degrees relative to light beams 250a and 250b or scan head 230 could be rotated through 90 degrees. The second measurement along the x'-axis may then be made using grating 20 in the same way as described above for the y'-axis. Typically, scan head 230 is moved with respect to wafer 100 rather than moving stage 200 because the optical scan head can be made to be much smaller and lighter than stage 200. Several embodiments of the optical scanner, as well as alternative alignment scanners, are described in the above referenced U.S. Pat. No. 6,023,338.

In alternative embodiments of the alignment scanner used to scan the mark of the present invention, multiple beams of light may be created through various techniques. These various techniques do not require the use of a diffraction grating. One alternative technique is to connect separate mediums for transmitting light to the single light source 140.

For example, multiple optical fibers may be connected to the light source 140 so that each fiber transmits light from the light source 140 such that a beam of light is directed towards the alignment mark. Another alternative technique for creating multiple light beams is to use a single light source 140 for each of the desired light beams. Of course, any combination of using multiple light sources and using optical fibers connected to the light sources may also be used.

Figure 4:
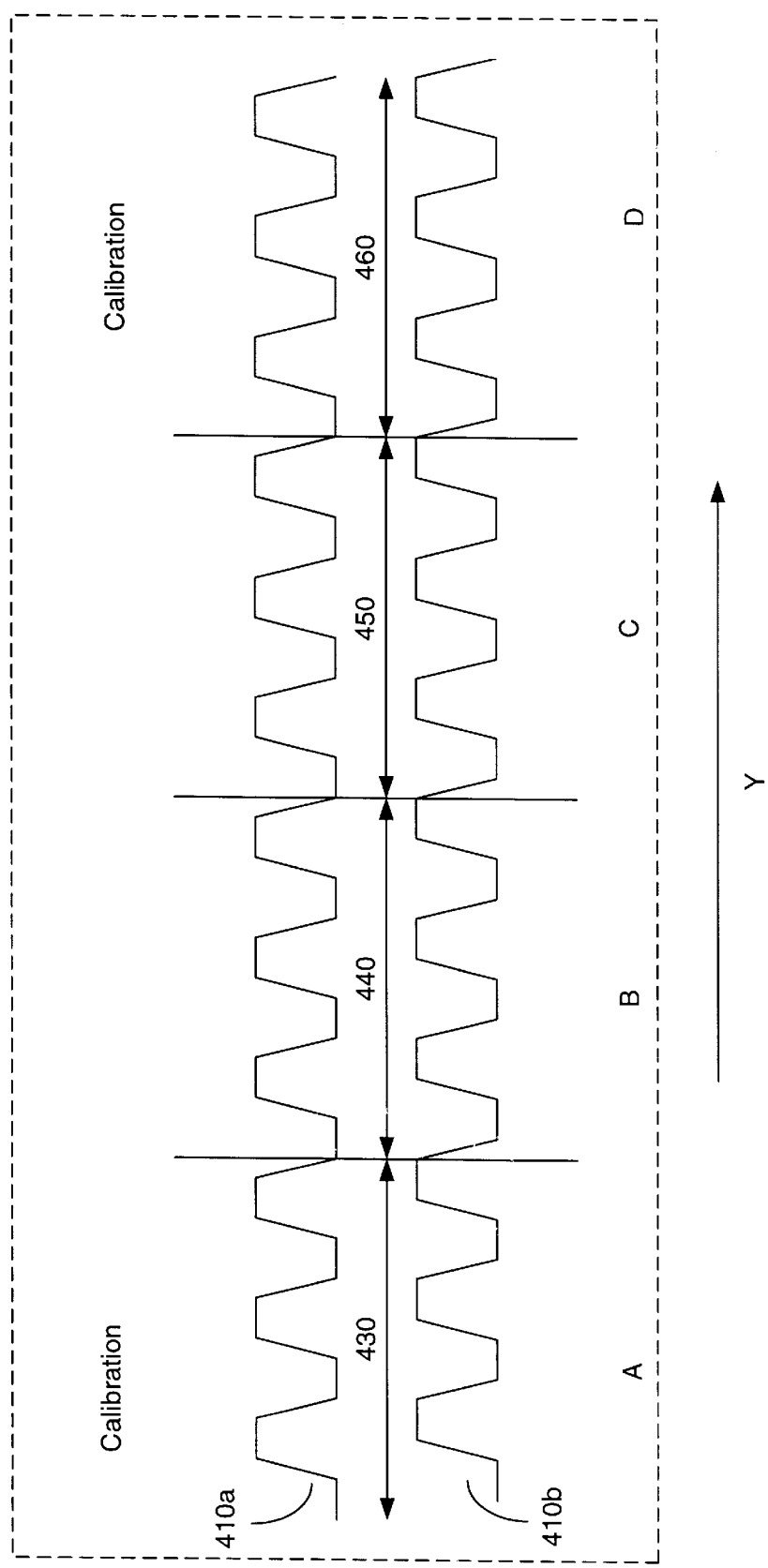
FIG. 4 illustrates in time and position the relationship of the signals developed by each of the light beams in FIG. 3.

The waveforms that are generated by the measurement process described above are presented in FIG. 4. The waveform 410a corresponds to the output of the digitizer 180a (FIG. 2), and the waveform 410b corresponds to the output of digitizer 180b (FIG. 2). The vertical axis in FIG. 4 represents the magnitude of the detected light, and the horizontal axis represents elapsed time. Since the scan rate is essentially constant, the elapsed time is proportional to the scan distance, so that the horizontal axis also represents position in the scan direction.

To illustrate how the misalignment between the two layers on wafer 100 is determined, waveforms 410a and 410b in FIG. 4 are drawn for such a misalignment, as well as an offset between the axes of wafer 100 (x, y, and z) and the axes of scan head 230 (x', y' and z'). The following discussion requires reference to both FIGS. 3 and 4 simultaneously. In FIG. 4 waveforms 410a and 410b are shown in relation to each other as scan head 230 is advanced across wafer 100 (here moved along the y-axis). Those waveforms are all shown divided into four segments 430, 440, 450 and 460. Segment 430 represents the signals obtained by scanning a calibration zone, which includes periodic structure set 70a (see FIG. 3). Segment 440 represents the signals obtained by scanning a first test zone, which includes periodic structure sets 70b and 60c. Segment 450 represents the signals obtained by scanning a second test zone, which includes periodic structure sets 60b and 70c. Segment 460 represents the signals obtained by scanning another calibration zone, which includes periodic structure set 60a. Each of the swells in the waveforms indicate the detection of each of the periodic structures in the alignment mark.

The first segment 430 of signals 410a and 410b is a first calibration segment since both signals correspond to a time when both illumination points, 250a and 250b, impinge on lines 70a of mark 30, as the scan head is translated in the positive y-direction. In segment 430, the system-wafer offset may be determined by determining the relative positions of spots 250a and 250b with respect to the measurement axis since there is no alignment error within structure set 70a (i.e., the offset of the axes of the first layer of semiconductor wafer 100 and scan head 230 can be determined with that portion of the grating contributed by the first layer of the semiconductor wafer).

The second segment 440 is a measurement segment since each of signals 410a and 410b are contributed by the scanning of portions of mark 30 contributed by each of the two layers of semiconductor wafer 100 (e.g., spot 250a impinges on lines 60c of the second layer and spot 250b impinges on line 70b of the first layer).

The third segment 450 is a second measurement segment since each of the signals 410a and 410b are also contributed by the scanning of portions of mark 30 contributed by each of the two layers of semiconductor wafer 100 (i.e., spot 250a impinges on lines 70c of a first layer and spot 250b impinges on lines 60b of a second layer).

The fourth segment 460 of signals 410a and 410b is a second calibration segment since both signals are obtained from lines 60a on a second layer of wafer 100 (i.e., both signals correspond to a time when both illumination points, 250a and 250b impinge on lines 60a as scan head 230 is translated in the positive y-direction). In segment 460 the relationship of spots 250a and 250b with respect to the measurement axis can be determined since there is no alignment error between the lines 60a (i.e., the offset of the axes of the second layer of semiconductor wafer 100 and scan head 230 can be determined with that portion of the mark contributed by the second layer of the semiconductor wafer).

The calculations performed by computer 190 consist of a determination of the phase differences during the four segments 430, 440, 450 and 460. The phase differences during segments 430 and 460 can be due to the previously explained imperfect rotational alignment of the pattern on wafer 100 and the axes of scan head 230. Other sources of measurement error that can produce a fixed phase difference between the illumination points are electrical delays and optical aberrations.

The first step in determining the y-axis registration error between the two layers of wafer 100 is to obtain the average phase error between the waveforms 410a and 410b during segments 440 and 450. The second step is to subtract the offset error of the same waveforms obtained from scanning the calibration segments 430 and 460. This adjusted and averaged registration error is then the actual registration error between two layers of wafer 100.

The registration error is calculated by D=P*φ, where P is the grating period and φ is the calibrated phase difference between the two signals, which is given by:

$$\phi=0.5(\phi_c-\phi_b)-0.5(\phi_a+\phi_d)$$

The parameters of this equation are defined as:

$\phi_a$=the phase difference between signals 410a and 410b during interval 430;

$\phi_b$=the phase difference between the same signals during interval 440;

$\phi_c$=the phase difference between the same signals during interval 450; and $\phi_d$=the phase difference between the same signals during the interval 460.

In these equations, the phase is expressed as a fraction of the period, so a phase of one is equal to one period.

Two testing segments are provided so that each illumination point, 250a and 250b, will scan over sets of periodic structure formed on each of the layers between which any registration error is to be measured. For example, in FIG. 3, illumination point 250a will pass over the lines of 60c, which are formed on one layer, and the lines of 70c, which are formed on a different layer; similarly, illumination point 250b will pass over the lines of 70b and 60b, which are formed on each of the two layers of wafer 100. By guiding the illumination spots over two testing zones, the registration error between the two layers is measured twice. The registration error is measured the first time in the first test zone where illumination spot 250a travels over lines formed on the second layer (60c) and spot 250b travels over lines formed on the first layer (70b). When the registration error is measured the second time in the second test zone, spot 250a travels over lines formed in the first layer (70c) and spot 250b travels over lines formed in the second layer (60b). An average registration error is obtained by averaging these two registration error values.

Averaging the two measured registration error values results in substantially reducing measurement errors introduced by asymmetries between the lines formed on the different layers of the wafer and between the two measuring beams. As a result, the average registration error value is more accurate than either of the individually measured registration error values. For further description as to the sources of asymmetries that are accounted for by the method of averaging two separate misregistration values, referred to U.S. Patent Application Ser. No. 09/603,120.

Figure 5:
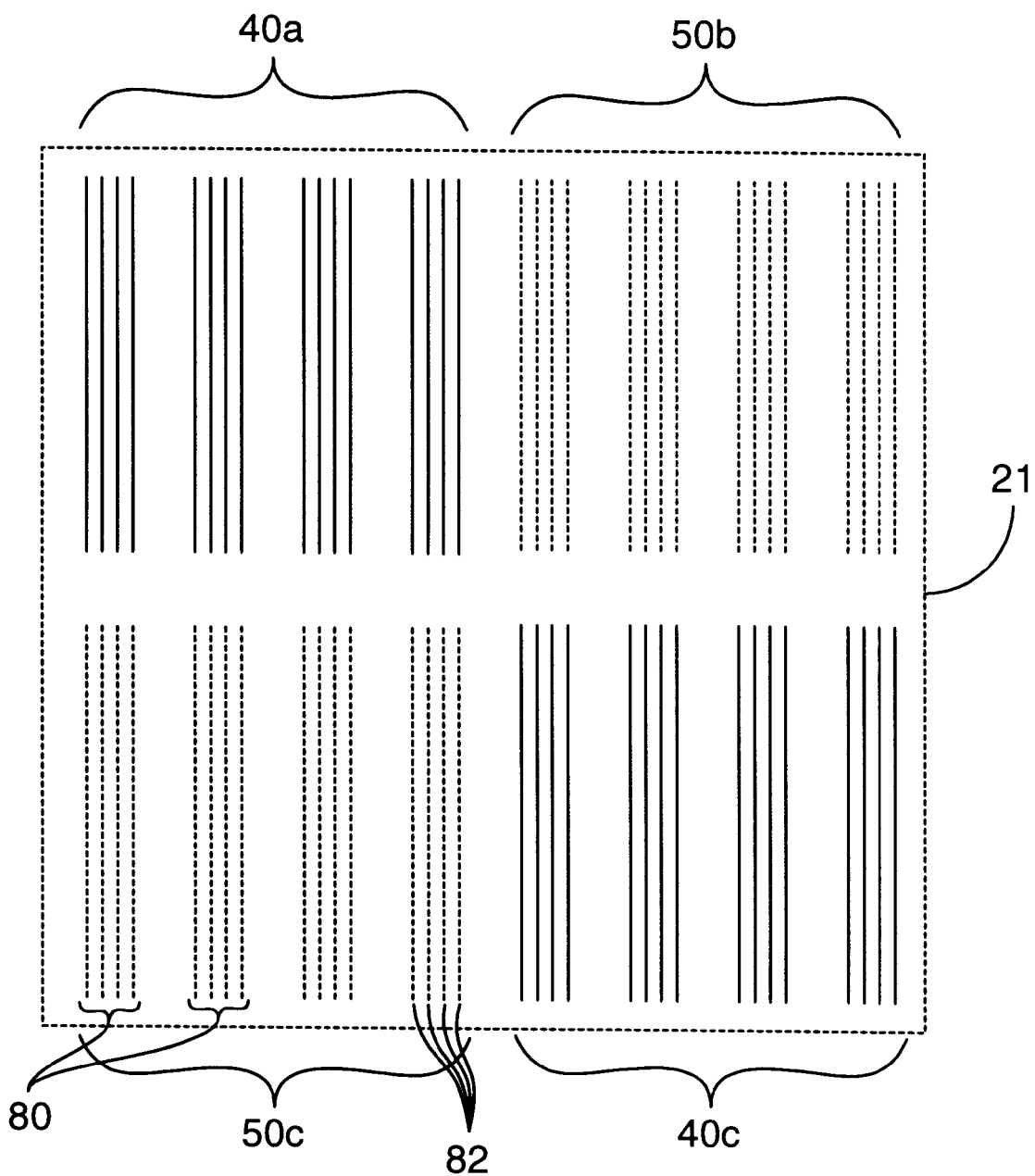
FIG. 5 illustrates a top plan view of an alternative embodiment of the alignment mark that includes two test zones.

FIG. 5 represents a top plan view of an alignment mark 21 according to an alternative embodiment of the invention. Alignment mark 21 includes two test zones for determining the registration error between two wafer layers. The first test zone includes periodic structure sets 40*b* and 50*c*, while the second test zone includes periodic structure sets 50*b* and 40*c*. Each of the periodic structure sets includes individual periodic structures 80. The individual periodic structures, in turn, are formed by multiple sub-structures 82. The individual periodic structures 80 are elongated and rectangular in shape, and are parallel to each other. The sub-structures are linear in shape and are also parallel to each other. The periodic structures in the first test zone (40*b* and 50*c*) and second test zone (50*b* and 40*c*) are aligned so that the structures are placed proximate to a respective structure in the opposite structure set and so that each pair of opposing structures are co-linear. It is noted that in alternative embodiments of the alignment mark, the structure sets within each test zone may be placed in different areas of the wafer so that the sets are not proximate to each other. The structure sets, however, still should be formed with the goal of placing the individual structures co-linear with the opposite structure.

Figure 6:
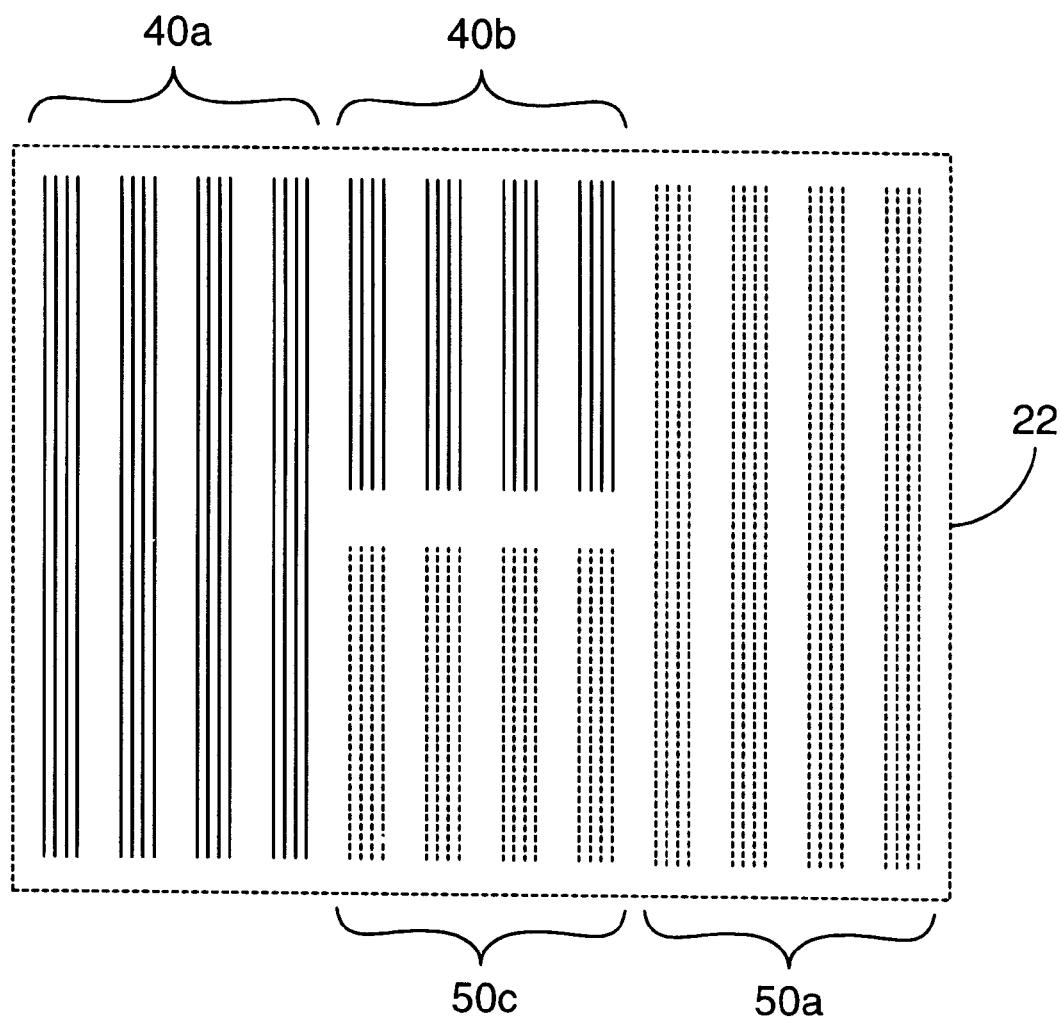
FIG. 6 illustrates a top plan view of an alternative embodiment of the alignment mark that contains two calibration zones and one test zone.

FIG. 6 illustrates a top plan view of the alignment mark 22, an alternative embodiment of the present invention. Alignment mark 22 includes two calibration zones and one test zone. In this embodiment, the two calibration zones allow the system-wafer offset value to be determined. The single test zone provides the misregistration value without the need for averaging two separate misregistration values, as is required for mark 10 in FIG. 1. The first calibration zone includes periodic structure set 40*a* and the second calibration zone includes periodic structure set 50*a*. The test zone includes periodic structure sets 40*b* and 50*c*. All of the individual periodic structures are elongated and rectangular in shape. The sub-structures are linear in shape.

Figure 7:
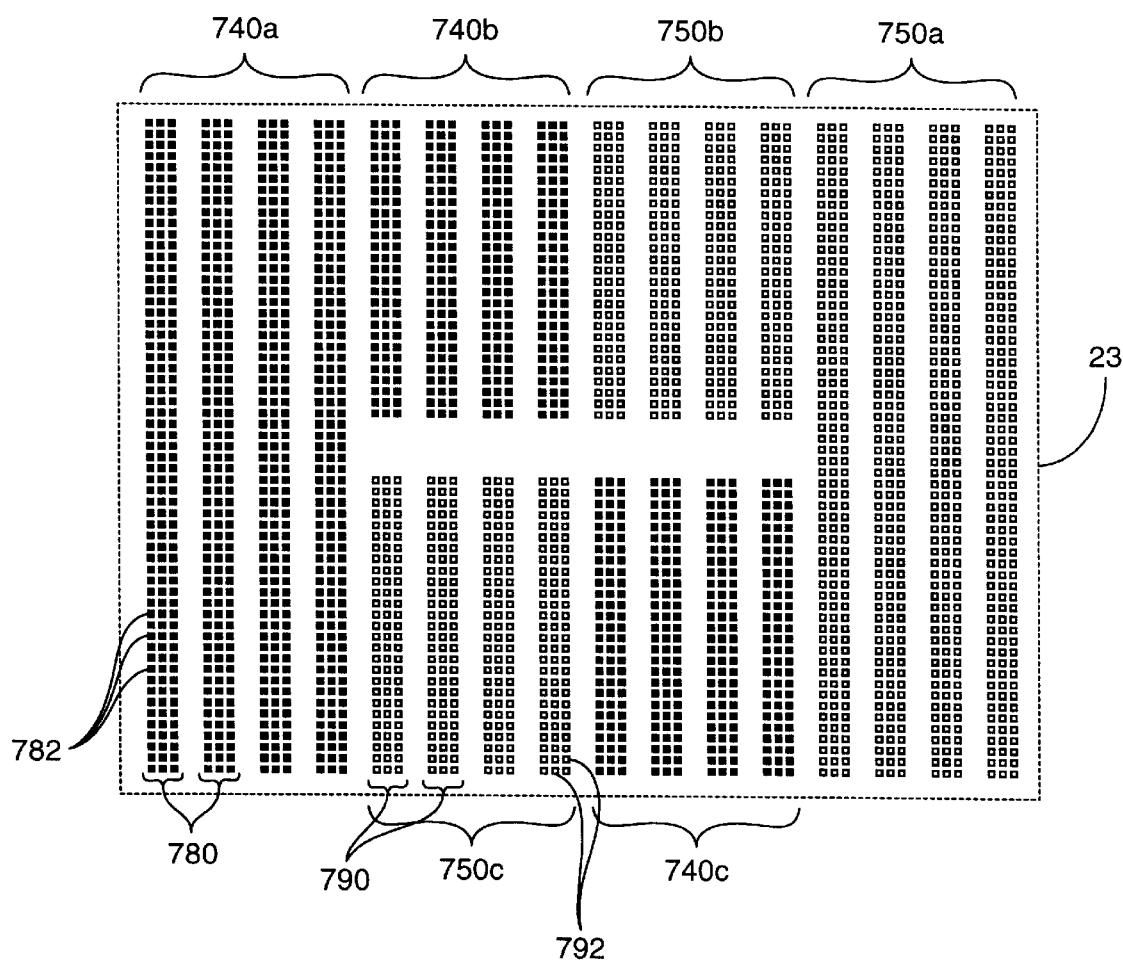
FIG. 7 illustrates a top plan view of an alternative embodiment of the alignment mark that contains rectangular periodic structures and square-shaped sub-structures.

FIG. 7 illustrates a top plan view of the alignment mark 23, which is yet another embodiment of the present invention. Alignment mark 23 contains two calibration zones and two test zones in a similar configuration as the mark 20 in FIG. 1. Periodic structure sets 740*a* and 750*a* form each of the two calibration zones, and each include elongated and rectangular periodic structures 780. Periodic structure sets 740*b*, 740*c*, 750*b* and 750*c* form the two test zones, and each of the sets include elongated and rectangular periodic structures 790. The periodic structures 780 and 790 are formed by individual sub-structures 782 and 792, respectively. The sub-structures 782 and 792 are square-shaped and are arranged in rows and columns within each periodic structure. By forming each of the sub-structures 782 and 792 according to sizes that are more comparable to the sizes of the circuit patterns, the accuracy for determining the misregistration increases. As may be appreciated, the sub-structures may have any one of a variety of shapes. For example, the sub-structures may be triangular or circular. Also, the sub-structures may be in a variety of formations within the periodic structures. For example, within each periodic structure, the corresponding sub-structures may also be formed in a random pattern or in a hexagonal pattern.

For the purposes of distinguishing between the square shaped sub-structures formed on different wafer layers, the sub-structures on one layer are represented as solid square patterns while the sub-structures on a different layer are represented with the outline of a square. These square outline representations actually represent solid square sub-structure formations. This scheme of illustration is carried over into FIG. 8.

Figure 8:
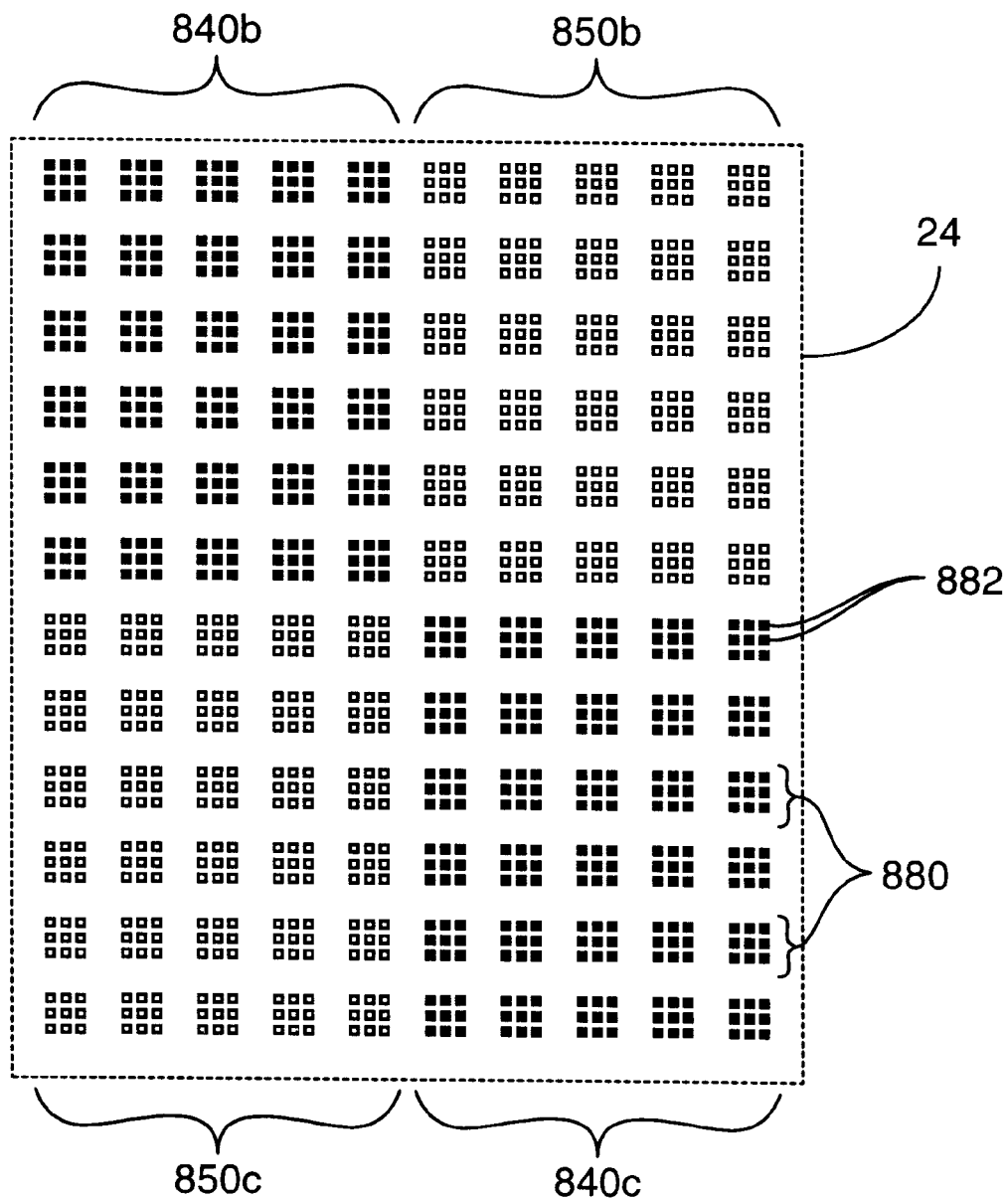
FIG. 8 illustrates a top plan view of an alternative embodiment of the alignment mark that contains square-shaped periodic structures.

FIG. 8 illustrates a top plan view of the alignment mark 24, which is another embodiment of the present invention. Alignment mark 24 contains two test zones in a similar configuration as mark 21 in FIG. 5. One test zone includes periodic structure sets 840*b* and 850*c*. The other test zone includes periodic structure sets 850*b* and 840*c*. Each of the structure sets formed by individual periodic structures 880, which are square shaped. The periodic structures 880 are arranged in equally spaced rows and columns. Each of the periodic structures, in turn, are formed by sub-structures 882, which are also square shaped. The sub-structures 882 are arranged in rows and columns within each of the periodic structures 880. As may be appreciated, the individual periodic structures and sub-structures may have a variety of shapes. Mark 24 can be used to measure the misregistration value in two separate directions that are perpendicular to each other since alignment mark 24 has the same repeating structural pattern in orthogonal directions. Mark 24 obviates the need to have one mark for each direction in which misregistation needs to be measured. In a variation on mark 24, calibration zones may be formed on each edge of the mark 24 so that the system-wafer offset may be determined for each direction of measurement.

Figure 9:
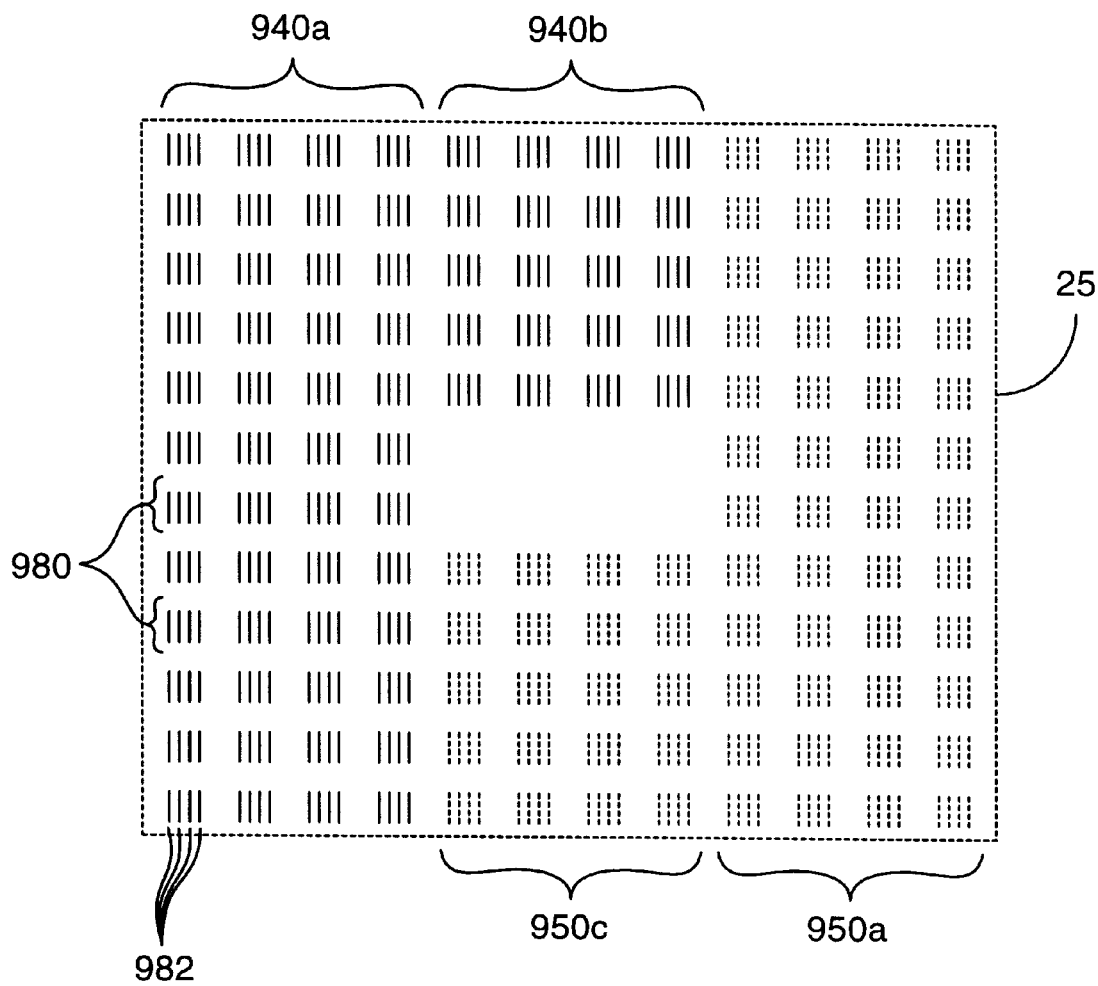
FIG. 9 illustrates a top plan view of an alternative embodiment of the alignment mark that contains square-shaped periodic structures and linear sub-structures.

FIG. 9 illustrates a top plan view of mark 25, which is another alternative embodiment of the present invention. Alignment mark 25 includes two calibration zones and one test zone in a similar configuration as mark 22 in FIG. 6. Periodic structure set 940*a* forms one of the calibration zones and structure set 950*a* forms the second calibration zone. Periodic structure sets 940*b* and 950*c* form the test zone. Each of the periodic structure sets is formed by individual periodic structures 980. The periodic structures are arranged in rows and columns within each of the sets of structures. The periodic structures are, in turn, formed by individual sub-structures 982. The periodic structures 980 are square shaped. The sub-structures 982 are parallel lines that are spaced apart from each other and run the length of each square shaped periodic structure 980. Smaller sized sub-structures 980 result by forming the square-shaped periodic structures 980 as opposed to the rectangular-shaped periodic structures 80 as in FIG. 1. Specifically, the linear sub-structures 982 are shorter in length than the linear sub-structures 82 in FIG. 1. The relatively smaller sub-structures 982 are more comparable to the sizes of the circuit patterns. This in turn, advantageously allows for an increased amount of accuracy in the measurement of the registration error.

In an alternative embodiment of the present invention, the periodic structures within one test zone may be composed of sub-test structures, while each of the periodic structures within a different test zone are not composed of sub-test structures, but are each a single pattern formation. Similarly, in other embodiments of the invention, the calibration structures within one calibration zone may be composed of sub-calibration structures, while each of the calibration structures within a different calibration zone are not composed of sub-calibration structures. Further variations of the present invention include marks in which variously shaped sub-test structures and sub-calibration structures are formed within a single alignment mark. For example, one test zone (or calibration zone) may contain linearly shaped sub-test structures and a different test zone (or calibration zone) may contain circularly shaped sub-test structures. Or, for example, one test zone (or calibration zone) may contain circularly shaped sub-test structures and a different test zone (or calibration zone) may contain square shaped sub-test structures. Also, for example, one test zone (or calibration zone) may contain linearly shaped sub-test structures and a different test zone (or calibration zone) may contain square shaped sub-test structures.

While this invention has been described in terms of several preferred embodiments, there are alteration, permutations, and equivalents that fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A mark for use in measuring the relative position between a first layer and a second layer of a semiconductor device wherein the second layer is a different layer than the first layer, the mark comprising:
   a first test zone that includes a first section and a second section, the first section containing a plurality of test structures formed on the first layer and the second section containing a plurality of test structures formed on the second layer, each of the test structures being composed of sub-test structures; and
   a second test zone that includes a first section and a second section, the first section containing a plurality of test structures formed on the first layer and the second section containing a plurality of test structures formed on the second layer, each of the test structures being composed of sub-test structures, the first section and the second section of the first test zone being positioned proximate to the second section and the first section, respectively, of the second test zone.

2. The mark as recited in claim 1 wherein the sub-test structures of the first layer are detectable through the second layer.

3. The mark as recited in claim 1 wherein the test structures have an elongated-rectangular outline, each of the test structures being parallel with respect to each other.

4. The mark as recited in claim 3 wherein the sub-test structures are lines, the lines being parallel to each other and aligned along the longitudinal axis of each respective test structure.

5. The mark as recited in claim 3 wherein the sub-test structures are squares, the squares being in a formation of rows and columns.

6. The mark as recited in claim 3 wherein the sub-test structures are circles, the circles being in a formation of rows and columns, or in a hexagonal formation.

7. The mark as recited in claim 1 wherein the test structures have square outlines, the test structures within each test zone being in a formation of rows and columns.

8. The mark as recited in claim 7 wherein the sub-test structures are squares, the squares being in a formation of rows and columns.

9. The mark as recited in claim 7 wherein the sub-test structures are circles, the circles being in a formation of rows and columns, or in a hexagonal formation.

10. The mark as recited in claim 1 wherein each of the test structures have a substantially uniform width, m, and each of the test structures within each test zone are separated by a substantially uniform distance, n.

11. The mark as recited in claim 10 wherein the width m and the distance n are substantially equal to each other.

12. The mark as recited in claim 1 wherein the sub-test structures have a sub-test structure width that is approximately the same size as the width of an integrated circuit element critical dimension formed within the semiconductor device.

13. A mark for use in measuring the relative position between a first layer and a second layer of a semiconductor device wherein the second layer is formed on a different layer than the first layer, the mark comprising:
   a first test zone that includes a first section and a second section, the first section containing a plurality of test structures formed on the first layer and the second section containing a plurality of test structures formed on the second layer, each of the test structures containing sub-test structures;
   a first calibration zone and a second calibration zone, the first calibration zone containing a plurality of calibration structures formed on the first layer and the second calibration zone containing a plurality of calibration structures formed on the second layer, each of the calibration structures containing sub-calibration structures, the first test zone being position in between and proximate to the first and second calibration zones.

14. The mark as recited in claim 13 further comprising a second test zone that includes a first section and a second section, the first section containing a plurality of test structures formed on the first layer and the second section containing a plurality of test structures formed on the second layer, each of the test structures being composed of sub-test structures, the first section and the second section of the first test zone being positioned proximate to the second section and the first section, respectively, of the second test zone, the first and second test zones being positioned in between the first and second calibration zones.

15. The mark as recited in claim 14 wherein the test structures and the calibration structures have an elongated rectangular outline, each of the test structures within each test zone and each of the calibration structures within each calibration zone being parallel with respect to each other.

16. The mark as recited in claim 15 wherein the sub-test structures and the sub-calibration structures are lines, the lines being parallel to each other and aligned along the longitudinal axis of each respective test structure and calibration structure.

17. The mark as recited in claim 14 wherein the test structures and the calibration structures have square outlines, the test structures and calibration structures within each test zone and calibration zone being in a formation of rows and columns.

18. The mark as recited in claim 17 wherein the sub-test structures and the sub-calibration structures are lines, the lines being parallel to each other.

19. The mark as recited in claim 17 wherein the sub-test structures and the sub-calibration structures are circles, the circles being in a formation of rows and columns.

20. The mark as recited in claim 14 wherein each of the test structures and calibration structures have a substantially uniform width, m, and each of the test structures within each test zone are separated by a substantially uniform distance, n, and each of the calibration structures within each calibration zone are also separated by the substantially uniform distance, n.

21. The mark as recited in claim 20 wherein the width m and the distance n are substantially equal to each other.

22. The mark as recited in claim 20 wherein the sub-test structures and the sub-calibration structures have a sub-test structure width and a sub-calibration structure width, respectively, that are approximately the same size as the width of an integrated circuit element critical dimension formed within the semiconductor device.

23. A mark for use in measuring the relative position between a first layer and a second layer of a semiconductor device wherein the second layer is a different layer than the first layer, the mark comprising:

a first test zone that includes a first section and a second section, the first section containing a plurality of test structures formed on the first layer and the second section containing a plurality of test structures formed on the second layer; and a second test zone that includes a first section and a second section, the first section containing a plurality of test structures formed on the first layer and the second section containing a plurality of test structures formed on the second layer, each of the test structures being composed of sub-test structures, the first section and the second section of the first test zone being positioned proximate to the second section and the first section, respectively, of the second test zone.

24. The mark as recited in claim 23 wherein the test structures have an elongated-rectangular outline, each of the test structures being parallel with respect to each other.

25. The mark as recited in claim 23 wherein the test structures have square outlines, the test structures within each test zone being in a formation of rows and columns.

26. The mark as recited in claim 23 wherein the sub-test structures within the second test zone are lines, the lines being parallel to each other.

27. The mark as recited in claim 23 wherein the sub-test structures within the second test zone are circles.

28. The mark as recited in claim 23 wherein the test structures within the first test zone are composed of sub-test structures.

29. The mark as recited in claim 28 wherein the sub-test structures of the first test zone are circles, and the sub-test structures of the second test zone are lines.

30. A method for measuring the relative position between a first layer and a second layer of a device wherein the second layer is formed on a different layer than the first layer, the method comprising:

providing a first test zone and a second test zone to facilitate measurement of the relative position between the two layers, each test zone including a first section and a second section, the first section containing a plurality of test structures formed on the first layer and the second section containing a plurality of test structures formed on the second layer, each of the test structures being composed of sub-test structures, the first section and the second section of the first test zone being positioned proximate to the second section and the first section, respectively, of the second test zone;

scanning a beam in a first path across portions of each test zone, wherein at least a portion of the beam reflects off the surface of the device after the beam impinges upon the device;

scanning a beam in a second path across portions of each test zone, wherein the first and second paths are physically separated from each other, also wherein at least a portion of the beam reflects off the surface of the device after the beam impinges upon the device;

generating a first signal proportional to an intensity of the reflected portion of the beam from the first path;

generating a second signal proportional to an intensity of the reflected portion of the beam from the second path;

calculating any registration error between the two layers based on the first signal and the second signal such that differences between the first and second signal that are caused by differences between characteristics of the first and second layer are minimized.

31. The method as recited in claim 30 wherein the test structures have an elongated-rectangular outline, each of the test structures being parallel with respect to each other.

32. The metal as recited in claim 31 wherein the sub-test structures are parallel lines, the parallel lines aligned along the longitudinal axis of each test structure.

33. The metal recited in claim 31 wherein the sub-test structures are circles, the circles being in a formation of rows and columns.

34. The method as recited in claim 30 wherein the test structures have square outlines, the test structures within each test zone being in a formation of rows and columns.

35. The method as recited in claim 34 wherein the sub-structures are circles, the circles being in a formation of rows and columns.

36. The method as recited in claim 30 wherein the registration error between the two layers is calculated by averaging a first registration error and a second registration error, the first registration error being based upon the first signal and the second registration error being based upon the second signal.

37. The mark as recited in claim 3 wherein the sub-test structures are circles, the circles being in a random formation.

38. The mark as recited in claim 7 wherein the sub-test structures are circles, the circles being in a random formation.

* * * * *

UNITED STATES PATENT AND TRADEMARK OFFICE
CERTIFICATE OF CORRECTION

PATENT NO. : 6,486,954 B1
DATED : November 26, 2002
INVENTOR(S) : Mieher et al.

It is certified that error appears in the above-identified patent and that said Letters Patent is hereby corrected as shown below:

<u>Column 16,</u>
Line 26, change "metal" to -- method --
Line 30, change "metal" to -- method --

Signed and Sealed this

Twenty-fifth Day of March, 2003

JAMES E. ROGAN
*Director of the United States Patent and Trademark Office*